United States Patent [19]
Van Der Plas et al.

[11] Patent Number: 5,254,494
[45] Date of Patent: Oct. 19, 1993

[54] METHOD OF MANUFACTURING A SEMICONDUCTOR DEVICE HAVING FIELD OXIDE REGIONS FORMED THROUGH OXIDATION

[75] Inventors: Paulus A. Van Der Plas; Nicole A. H. F. Wils; Andreas H. Montree, all of Eindhoven, Netherlands

[73] Assignee: U.S. Philips Corp., New York, N.Y.

[21] Appl. No.: 896,082

[22] Filed: Jun. 8, 1992

[30] Foreign Application Priority Data

Jun. 10, 1991 [EP] European Pat. Off. ......... 91201414.9

[51] Int. Cl.⁵ .......................................... H01L 21/76
[52] U.S. Cl. ........................................ 437/69; 437/70; 437/72; 437/73; 148/DIG. 117
[58] Field of Search .................. 437/72, 73, 69, 70; 148/DIG. 117

[56] References Cited

U.S. PATENT DOCUMENTS

| | | | |
|---|---|---|---|
| 4,318,759 | 3/1982 | Trenary et al. | 156/662 |
| 4,407,696 | 10/1983 | Han et al. | 156/653 |
| 4,580,330 | 4/1986 | Pollack et al. | 29/576 |
| 4,708,768 | 11/1987 | Enomoto et al. | 156/657 |
| 4,755,477 | 7/1988 | Chao | 156/662 |

FOREIGN PATENT DOCUMENTS

| | | | |
|---|---|---|---|
| 0424018 | 4/1991 | European Pat. Off. | |
| 0296741 | 12/1986 | Japan | 437/69 |
| 0010836 | 1/1990 | Japan | 437/69 |

OTHER PUBLICATIONS

Wolf, "Silicon processing for the VLSI Era", vol. 2 pp. 28-33, 1990.

*Primary Examiner*—Brian E. Hearn
*Assistant Examiner*—Trung Dang
*Attorney, Agent, or Firm*—Steven R. Biren

[57] ABSTRACT

A method of manufacturing a semiconductor device includes forming field oxide regions (17) in a surface (1) of a silicon body (2) through oxidation, which body is provided with an oxidation mask (15) formed in a layered structure provided on the surface with a lower layer (4) of silicon oxide, an intermediate layer (5) of polycrystalline silicon and an upper layer (6) of a material including silicon nitride in which windows (8) are etched into the upper layer. The intermediate layer is etched away inside the windows and below an edge (10) of the windows, a cavity (11) is formed below the edge, and a material including silicon nitride is provided in the cavity. The material including silicon nitride is provided in the cavity while the surface of the silicon body situated inside the windows is still covered by a layer of silicon oxide, preferably with the lower layer of the layered structure. Field oxide regions can be provided in this way having the same dimensions as the photoresist mask (7) used for etching the window into the upper layer, while in addition a gate oxide (22) free from defects can be provided on the active regions (21) of the silicon body situated between the field oxide regions.

5 Claims, 2 Drawing Sheets

METHOD OF MANUFACTURING A SEMICONDUCTOR DEVICE HAVING FIELD OXIDE REGIONS FORMED THROUGH OXIDATION

BACKGROUND OF THE INVENTION

The invention relates to a method of manufacturing a semiconductor device whereby field oxide regions are formed in a surface of a silicon body through oxidation, which body is provided with an oxidation mask which is formed in a layered structure provided on the surface and comprising a lower layer of silicon oxide, an intermediate layer of polycrystalline silicon and an upper layer of material comprising silicon nitride, wherein windows are etched into the upper layer, the intermediate layer is removed by etching within the windows and below an edge of the windows, a cavity is formed below said edge, after which material comprising silicon nitride is provided in the cavity.

Such a method is particularly suitable for manufacturing semiconductor devices with field oxide regions of sub-micron dimensions. The field oxide regions can be formed practically without dimensional losses, i.e. they have dimensions which are practically identical to those of a photoresist mask which is used for providing the windows in the upper layer of the oxidation mask. In addition, the occurrence of defects in the silicon body during oxidation is avoided since the lower layer of silicon oxide and the intermediate layer of polycrystalline silicon in the oxidation mask (stress-relief layers) satisfactorily absorb stresses which may arise during the oxidation treatment owing to differences in coefficient of expansion between silicon and the material comprising silicon nitride.

After the field oxide regions have been formed, the oxidation mask is removed. Semiconductor elements are provided in the regions of the silicon body enclosed by the field oxide regions. The former regions are accordingly called "active regions". If these semiconductor elements are MOS transistors, the active regions are first provided with a layer of gate oxide, on which a gate electrode is then provided.

U.S. Pat. No. 4,755,477 discloses a method of the kind mentioned above whereby silicon nitride is provided below the edge. Before this is done, the lower layer of silicon oxide is first etched away inside the windows by means of a usual etchant solution.

The known method has the disadvantage that the gate oxide provided on the active regions enclosed by the field oxide may exhibit defects, so that breakdown of the gate oxide can occur at usual voltages between the gate electrode and the active region.

SUMMARY OF THE INVENTION

The invention has for its object inter alia to provide a method which renders it possible to provide a layer of gate oxide on the active regions enclosed by field oxide which does not exhibit the said defects.

According to the invention, the method mentioned above is for this purpose characterized in that the material comprising silicon nitride is provided in the cavity while the surface of the silicon body situated within the windows is covered by a layer of silicon oxide. It is achieved by this that the material comprising silicon nitride provided in the cavity does not come into direct contact with the silicon in the active regions. As a result, the oxidation mask can in practice be removed from the surface of the active regions after the formation of the field oxide regions in such a way that no remnants containing silicon nitride stay behind thereon. It is found that these remnants can cause the said defects since they hamper the growth of silicon oxide. In the known method as described, no silicon oxide is present in the windows between the surface of the silicon body and the silicon nitride which was provided there in the cavity below the edge of the windows. The silicon nitride, accordingly, is in direct contact with the silicon in the active regions, in which case silicon nitride remnants can stay behind in practice upon removal of the oxidation mask.

The surface of the silicon body situated inside the windows may be provided with a layer of silicon oxide through deposition or oxidation after the lower layer of silicon oxide has been removed here, as is the case in the known method described. Preferably, however, the material comprising silicon nitride is provided in the cavity while the silicon body inside the cavity is still covered with the lower layer of silicon oxide. The number of process steps is reduced by this. It was unexpectedly discovered that this layer is then still sufficiently capable of ensuring that the oxidation mask can be removed from the surface after the formation of the field oxide regions without remnants containing silicon nitride staying behind. A gate oxide free from defects can then be provided on the active regions.

The material comprising silicon nitride which is provided in the cavity may be silicon nitride itself, but alternatively it may be silicon oxynitride. Preferably, silicon nitride is used as the material comprising silicon nitride as a material for the upper layer of the oxidation mask and as a material to be provided in the cavity. Lateral growth of the field oxide is then counteracted most effectively.

When the method according to the invention is used, the lateral growth of the field oxide seen from the edge of the oxidation mask may be subdivided into a thick portion and a thin portion. These are called "bulk encroachment" and "bird's beak", respectively. When a layer of field oxide is formed with a thickness of, for example, 500 nm, a bulk encroachment arises with a thickness of approximately 250 nm over a distance of approximately 50 nm below the oxidation mask, and in addition a bird's beak up to a distance of approximately 150 nm with a thickness which is much smaller. After removal of the oxidation mask the formed field oxide can be etched away over approximately 20 nm of its thickness, whereby the bird's beak disappears entirely. A field oxide region is then formed which only exhibits a lateral growth which is equal to the bulk encroachment. In the example this is no more than 50 nm. The field oxide regions accordingly can be formed practically without dimensional losses; they have dimensions which are practically identical to those of a photoresist mask which is used for providing the windows in the upper layer of the oxidation mask.

According to the invention, this dimensional loss can be compensated for when the material comprising silicon nitride is provided in that, after the windows have been provided in the upper layer and the intermediate layer has been removed inside the windows and below the edges thereof, a layer of material comprising silicon nitride is deposited and an anisotropic etching treatment is carried out after this until the surface of the silicon substrate has been exposed within the windows. Not only is the cavity below the edge of the window filled up in this way, but a rim of material comprising silicon nitride is also formed within the windows. This rim ensures that windows are formed in the oxidation mask which are smaller than the windows in the upper layer, so that the field oxide regions formed will also be smaller than the windows in the upper layer. The said dimensional loss can be compensated for in this way.

A full compensation of this dimensional loss is obtained when the layer of material comprising silicon nitride is deposited on the upper layer, in the windows and below the rim of the windows with a thickness which is practically equal to the distance over which the field oxide regions show bulk encroachment in lateral direction.

BRIEF DESCRIPTION OF THE DRAWING

The invention will be explained in more detail below by way of example, with reference to the drawing, in which.

DESCRIPTION OF THE PREFERRED EMBODIMENT

Figure 1:
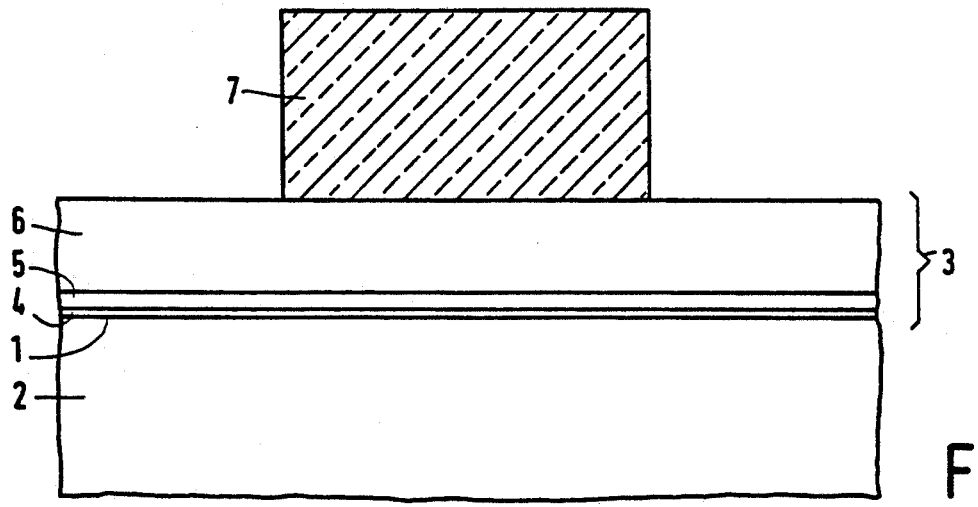
FIGS. 1 to 6 diagrammatically show in cross-section successive stages of manufacture of a semiconductor device which is made by means of the method according to the invention.
Figure 2:
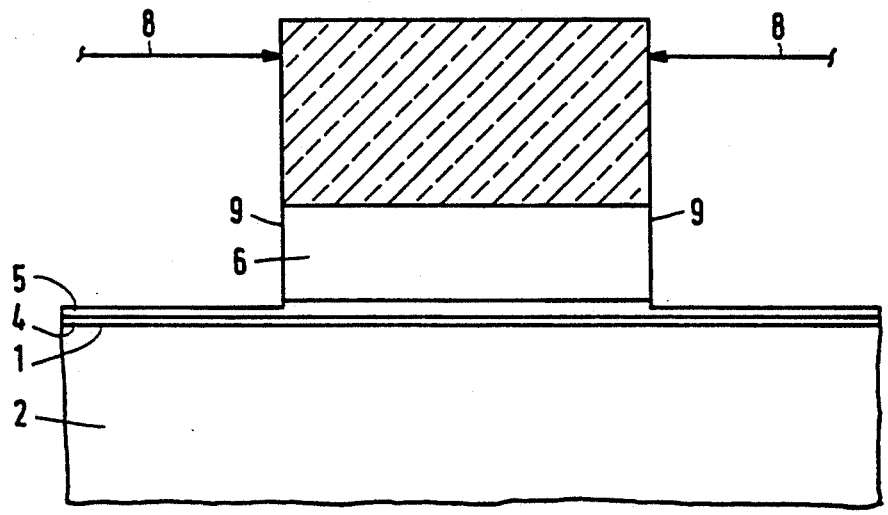
Figure 3:
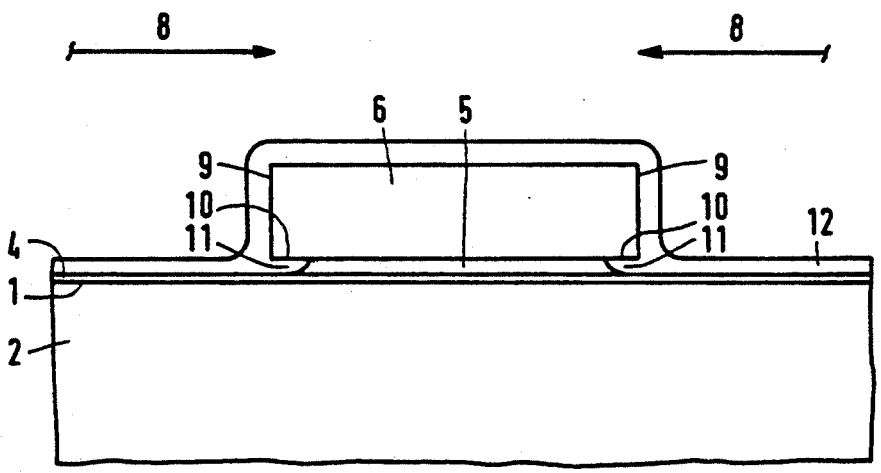
Figure 4:
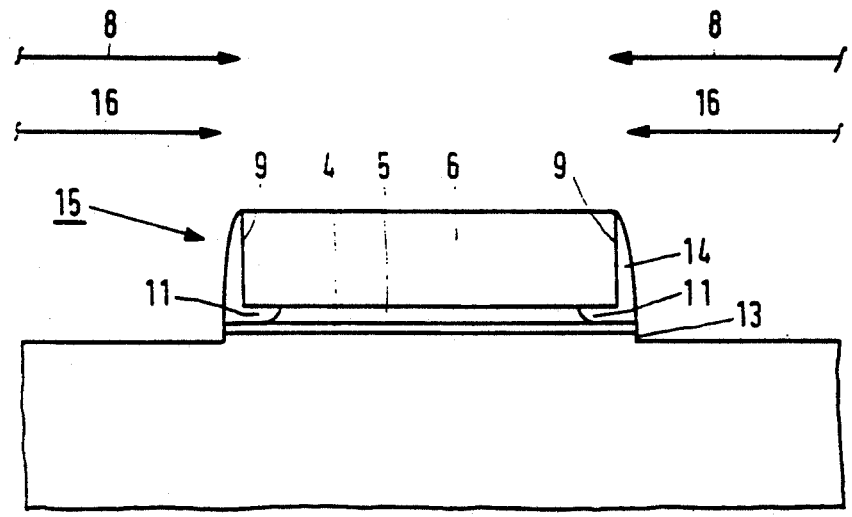
Figure 5:
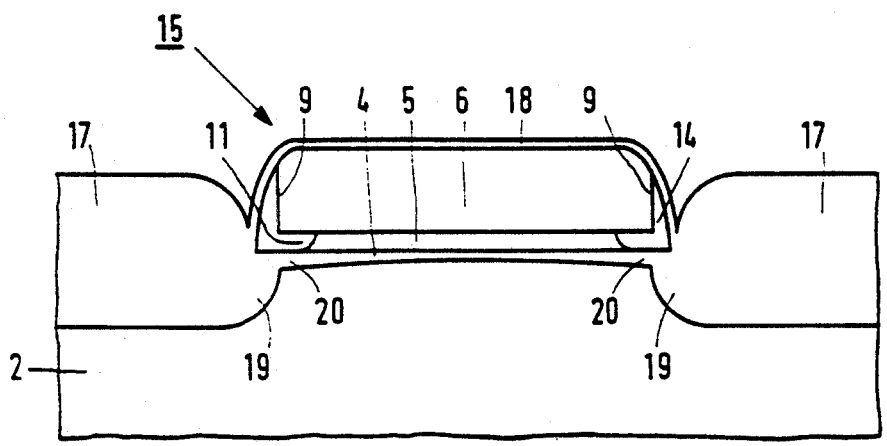
Figure 6:
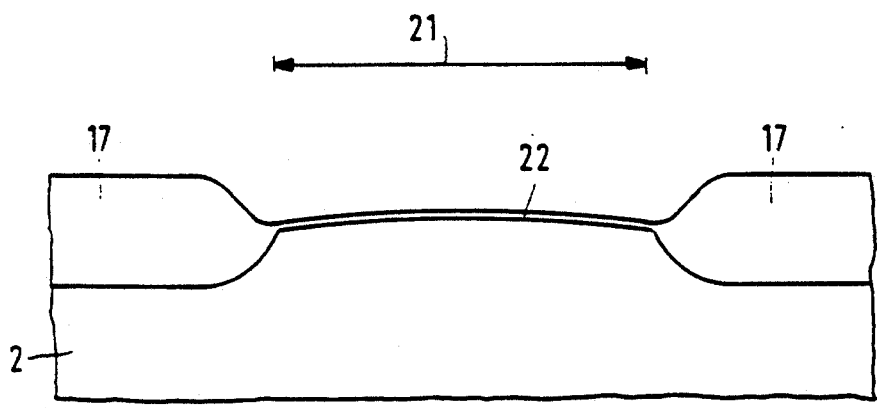

FIGS. 1 to 6 show a number of successive stages of manufacture of a semiconductor device by means of a method in which field oxide regions 17 are formed in a surface 1 of a silicon body 2 through oxidation. The surface 1 is provided with an oxidation mask 15 which is formed in a layered structure 3 provided on the surface 1, with a lower layer 4 of silicon oxide, an intermediate layer 5 of polycrystalline silicon and an upper layer 6 of material comprising silicon nitride.

The lower layer 4 is formed through oxidation of the surface 1 of the silicon body 2 in oxygen at a temperature of approximately 900° C., whereby a layer with a thickness of 5 to 15 nm, for example 8 nm, is grown. The intermediate layer 5 is formed in usual manner through deposition from $SiH_4$ at a temperature of approximately 600° C., whereby a layer with a thickness of 40 to 100 nm, for example 50 nm, is deposited. The upper layer is formed in usual manner through deposition at a temperature of approximately 800° C. from a gas mixture comprising $SiH_4$ and $NH_3$ to a thickness of 200 to 300 nm, for example 250 nm.

The layered structure 3 is provided with a photoresist mask 7 in those locations where the oxidation mask 15 is to be formed. After that, windows 8 are etched anisotropically in the upper layer in a plasma which is formed in a gas mixture comprising $CF_4$, $CHF_3$, $O_2$ and Ar. Windows with straight walls 9 are thus formed. The etching treatment is stopped when the intermediate layer 5 is reached, this layer accordingly being etched away over a small portion of its thickness. In practice this is done in that etching is made to continue during an empirically determined time.

The intermediate layer 5 is then isotropically etched away within the windows 8 and below an edge 10 of the windows 8 in a plasma formed in a gas mixture comprising $CF_4$ and $O_2$. Polycrystalline silicon can be selectively removed relative to the material comprising silicon nitride of the upper layer 6 and the silicon oxide of the lower layer 4 by means of such a plasma. This etching treatment is continued until the intermediate layer has been etched away below the edge 10 of the upper layer 6 over a distance of 15 to 75 nm, for example 50 nm. A cavity 11 is formed during this process.

A material comprising silicon nitride is provided in the cavity 11 while, according to the invention, the surface 1 of the silicon body 2 situated within the windows 8 is covered by a layer of silicon oxide. The surface 1 of the silicon body 2 situated within the windows may be provided with a layer of silicon oxide through deposition or oxidation after the lower layer 4 has been removed here. Preferably, the material comprising silicon nitride is provided in the cavity 11 while the silicon body is still covered by the lower layer of silicon oxide 4. The number of process steps is reduced in this way.

The material comprising silicon nitride is provided in the cavity, according to the invention, in that a layer of material 12 comprising silicon nitride is deposited after the windows 8 have been provided in the upper layer 6 and after the intermediate layer 5 has been etched away inside the windows 8 and below the edge 10 of the upper layer 6, and in that an anisotropic etching treatment is then carried out until the surface 1 of the silicon body 2 has been reached inside the windows 8. The layer 12 is deposited in the same deposition process as the upper layer 6 of the layered structure 3; a layer with a thickness of 20 to 100 nm, for example 50 nm, being deposited. Etching is carried out in a similar plasma to the one in which the upper layer 6 was etched. Etching is stopped when the silicon body 2 is reached. This again takes place in that etching is stopped after an empirically determined time. The silicon body 2 is etched away over a small depth 13 of, for example, 20 nm during this. After this etching treatment not only the cavity 11 is filled, but a rim 14 of material comprising silicon nitride is also formed inside the windows 8. An oxidation mask 15 with windows 16 is thus formed in the layered structure 4, 5, 6 which are smaller than the windows 8 in the upper layer 6 by approximately the thickness of the layer 12.

After the oxidation mask 15 has been provided, the semiconductor body 2 is subjected to a usual oxidation treatment whereby it is heated in a steam atmosphere at a temperature of approximately 1000° C. Field oxide regions 17 are formed with a thickness of approximately 500 nm. The oxidation mask is also oxidized during this, a thin layer of silicon oxide 18 being formed thereon.

Subsequently, the oxidation mask 15 is removed in that first the layer of silicon oxide 18 is removed by etching in a usual HF-containing bath, in that then the material 6, 11, 14 comprising silicon nitride is etched away in a usual bath comprising $H_3PO_4$ and $H_2SO_4$, in that then the intermediate layer 5 of polycrystalline silicon is etched away in baths containing KOH, and in that finally the lower layer of silicon oxide 4 is etched away in a usual bath containing HF.

A lateral growth of oxide below the rim 14 of the oxidation mask 15 takes place during growing of the field oxide regions 17. This lateral growth can be subdivided into a thick portion 19 and a thin portion 20. These are called "bulk encroachment" and "bird's beak", respectively. The bulk encroachment here extends approximately 50 nm below the rim 14, while the bird's beak extends approximately 150 nm. The bird's beak 20 has a thickness which ranges from approximately 20 nm at its boundary with the bulk encroachment 19 down to the thickness of the lower layer 4. After removal of the oxidation mask 15, the etching treatment in which the lower layer 4 of the oxidation mask 15 is removed is continued until the bird's beak has been etched away. During the removal of the oxidation mask 15 and etching away of the bird's beak 20, the field oxide regions 17 become in total approximately 100 nm thinner, while the region 21 of the silicon body 2 enclosed by the field oxide regions 17 and in which semiconductor elements can be provided, also called the active region, become larger. After this the active region 21 is provided with an approximately 15 nm thick layer of gate oxide 22 in a usual atmosphere comprising $O_2$ at a temperature of approximately 900° C.

The material comprising silicon nitride referred to above may be silicon nitride, but alternatively, for example, silicon oxynitride. To restrict the lateral growth with bulk encroachment 19 and bird's beak as much as possible, silicon nitride is preferably provided in the cavity 11. In that case the bulk encroachment in the example described above is no more than approximately 50 nm. When an oxidation mask is used whose upper layer 6 is made of silicon nitride, while the cavity 11 is filled with silicon oxynitride SiON, deposited at a temperature of approximately 850° C. from a gas mixture comprising $SiH_4$, $NH_3$ and NO, then the bulk encroachment is approximately 100 nm.

The layer 12 is preferably provided with a thickness which is practically equal to the distance over which the bulk encroachment grows below the rim 14 of the oxidation mask 15. In the present example this is approximately 50 nm. It is achieved in this way that the active regions 21 have practically the same dimensions as the photoresist mask 7 by which the windows 8 are obtained in the upper layer 6 of the layered structure 4, 5, 6 in which the oxidation mask 15 is formed.

To ensure that the cavity 11 is completely filled with the material comprising silicon nitride, polycrystalline silicon 5 is provided on the intermediate layer with a thickness which is substantially equal to that of the layer of material 12 comprising silicon nitride.

After the formation of the field oxide regions 17 the silicon nitride of the upper layer 6 of the oxidation mask 15 and the silicon nitride provided in the cavity 11 can be so effectively removed from the active regions 21 that a gate oxide 22 free from defects can be provided there. This is because this silicon nitride is separated from the silicon body 2 by a layer of silicon oxide, preferably by the lower layer 4 of the layered structure 4, 5, 6 in which the oxidation mask is formed. If this were not the case, remnants would stay behind upon the removal of the nitride which hamper the formation of a homogeneous layer of gate oxide. The gate oxide layer 22 would then become so thin locally that local breakdown of the gate oxide may occur at usual voltages between a gate electrode to be provided on the gate oxide and the silicon in the active region. The lower layer 4 of the oxidation mask 15 is found to be still so good after the formation of the oxidation mask 15 that the occurrence of the said defects is counteracted.

We claim:

1. A method of manufacturing a semiconductor device in which field oxide regions are formed in a surface of a silicon body through oxidation, wherein said body is provided with an oxidation mask which is formed in a layered structure provided on the surface and comprising a lower layer of silicon oxide, an intermediate layer of polycrystalline silicon and an upper layer of material comprising silicon nitride, windows are etched into the upper layer, the intermediate layer is removed by etching within the windows and below an edge of the windows, a cavity being formed below said edge, after which material comprising silicon nitride is provided in the cavity while the surface of the silicon body situated within the windows is covered by the layer of silicon oxide.

2. A method as claimed in claim 1, characterized in that the material comprising silicon nitride which is provided in the cavity is silicon nitride.

3. A method as claimed in claim 1, characterized in that the material comprising silicon nitride is provided in that, after the windows have been provided in the upper layer and the intermediate layer has been removed within the windows and below the edge of the windows, a layer of material comprising silicon nitride is deposited and in that then an anisotropic etching treatment is carried out until the surface of the silicon substrate has been exposed within the windows.

4. A method as claimed in claim 3, characterized in that the intermediate layer of polycrystalline silicon of the layered structure is provided with a thickness which is substantially equal to that of the layer of material comprising silicon nitride which is deposited on the upper layer, in the windows and below the edge of the windows.

5. A method as claimed in claim 4, characterized in that the layer of material comprising silicon nitride is deposited on the upperlayer, in the windows and below the edge of the windows with a thickness which is practically equal to the distance over which the field oxide regions exhibit bulk encroachment in lateral direction.

* * * * *